(12) United States Patent
Chen et al.

(10) Patent No.: US 10,686,444 B1
(45) Date of Patent: Jun. 16, 2020

(54) STRESS-RELAXED VOLTAGE-LEVEL SHIFTER

(71) Applicant: HIMAX TECHNOLOGIES LIMITED, Tainan (TW)

(72) Inventors: Ping-Liang Chen, Tainan (TW); Chun-Yu Liu, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/699,131

(22) Filed: Nov. 29, 2019

(51) Int. Cl.
*H03K 19/0175* (2006.01)
*H03K 19/0185* (2006.01)
*H03K 19/003* (2006.01)

(52) U.S. Cl.
CPC ........... *H03K 19/018528* (2013.01); *H03K 19/00315* (2013.01)

(58) Field of Classification Search
None
See application file for complete search history.

(56) References Cited

U.S. PATENT DOCUMENTS

| | | | |
|---|---|---|---|
| 6,268,744 B1 * | 7/2001 | Drapkin | H03K 19/00315 326/63 |
| 7,227,400 B1 * | 6/2007 | Gillespie | H03K 19/00315 327/333 |
| 2008/0036538 A1 * | 2/2008 | Lee | H03F 3/3022 330/255 |

* cited by examiner

*Primary Examiner* — Anh Q Tran
(74) *Attorney, Agent, or Firm* — Winston Hsu

(57) ABSTRACT

The present invention provides a voltage level shifter architecture applicable for positive and negative voltage shifting, in which a shielding circuit is configured to relax the voltage stress of the transistors in the input stage circuit, and a switching circuit is configured to avoid current leakage. In addition, designing the power domain(s) of the n-well P-type transistors in the voltage-level shifter makes the voltage-level shifter area-efficient and power-efficient or design-flexible and application-adaptive.

23 Claims, 9 Drawing Sheets

STRESS-RELAXED VOLTAGE-LEVEL SHIFTER

BACKGROUND OF THE INVENTION

1. Field of the Invention

The present invention relates to a stress-relaxed voltage-level shifter, and more particularly, to a stress-relaxed voltage-level shifter using a shielding circuit.

2. Description of the Prior Art

A negative level shifter is used to convert a positive input logic signal swinging from ground (0 Volt) to a positive system voltage (VDDD) into a negative output signal swinging from ground to a negative high voltage VSN (|VSN|>VDDD). For example, FIG. 7 is a functional block diagram of a negative level shifter 7 according to the prior art. A first stage circuit is configured to convert a pair of input signals NN and NNB into a pair of first intermediate signals swinging from a system voltage VSSD (e.g., 0V) to a system voltage VDDD (e.g., 1.2V). A second stage circuit is configured to convert the pair of first intermediate signals into a pair of second intermediate signals swinging from a system voltage VDDDN (e.g., VDDDN=VSN/2=−2.75V) to the system voltage VSSA (e.g., 0V). A third stage circuit is configured to convert the pair of second intermediate signals into a pair of output signals NN_OUT and NN_OUTB swinging from a system voltage VSN (e.g., −5.5V) to the system voltage VSSA. However, applicant notices that the negative level shifter 7 is power consuming due to the second stage circuit, but a large voltage difference between the first and third stage circuit may lead to voltage stress risk if the second stage circuit is removed from the negative level shifter 7. Therefore, there is a need to solve the dilemma between power consumption and voltage stress risk.

Further, negative level shifters are widely used in various applications such as in flash memories for F-N tunneling erase operation of memory cells, and in a display driver for TFT (Thin Film Transistor) on/off operation. However, as the positive system voltage keeps lowering below 1.5V, the contention between the pull-up transistors and pull-down transistors becomes very serious during the transient switching, leading to an increased switching delay, large dynamic power consumption and a larger circuit area.

Therefore, in consideration of power consumption, voltage stress risk, area-efficient, high-speed and low-power, negative level shifters are of great importance in low voltage applications nowadays.

SUMMARY OF THE INVENTION

It is therefore an objective of the present invention to provide a stress-relaxed voltage-level shifter.

The present invention discloses a negative voltage-level shifter including an input stage circuit and a push-pull stage circuit. The input stage circuit is configured to generate a first intermediate signal and a second intermediate signal with a first voltage swing between a first system voltage and a second system voltage according to a first input logic signal and a second input logic signal. The input stage circuit includes a comparator configured to compare the first input logic signal with the second input logic signal; an current mirror configured to adjust magnitudes of the first intermediate signal and the second intermediate signal; a first shielding circuit coupled to the current mirror and the comparator, and configured to reduce a first voltage stress applied to the comparator according to a third system voltage and reduce a second voltage stress applied to the current mirror according to a fourth system voltage; a second shielding circuit coupled to the first shielding circuit, and configured to generate the first intermediate signal according to a first operating voltage of the input stage circuit; and a switching circuit coupled to the second shielding circuit and the current mirror, and configured to generate the second intermediate signal according to a second operating voltage of the input stage circuit. The push-pull stage circuit is coupled to the second shielding circuit and the switching circuit, and configured to generate a first output signal and a second output signal with a second voltage swing between the third system voltage and the second system voltage according to the first intermediate signal and the second intermediate signal; wherein the second shielding circuit is configured to reduce a third voltage stress applied to the push-pull stage circuit; wherein the first system voltage is positive, and the second system voltage is negative.

The present invention further discloses a positive voltage-level shifter including an input stage circuit and a push-pull stage circuit. The input stage circuit is configured to generate a first intermediate signal and a second intermediate signal with a voltage swing between a first system voltage and a second system voltage according to a first input logic signal and a second input logic signal. The input stage circuit includes a comparator configured to compare the first input logic signal with the second input logic signal; a shielding circuit coupled to the comparator, configured to reduce a voltage stress applied to the comparator; an current mirror configured to adjust magnitudes of the first intermediate signal and the second intermediate signal; and a switching circuit coupled to the current mirror, and configured to generate the second intermediate signal. The push-pull stage circuit is coupled to the switching circuit, the current mirror and the shielding circuit, and configured to generate a first output signal and a second output signal with the voltage swing according to the first intermediate signal and the second intermediate signal; wherein the first system voltage is positive, and the second system voltage is a ground voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
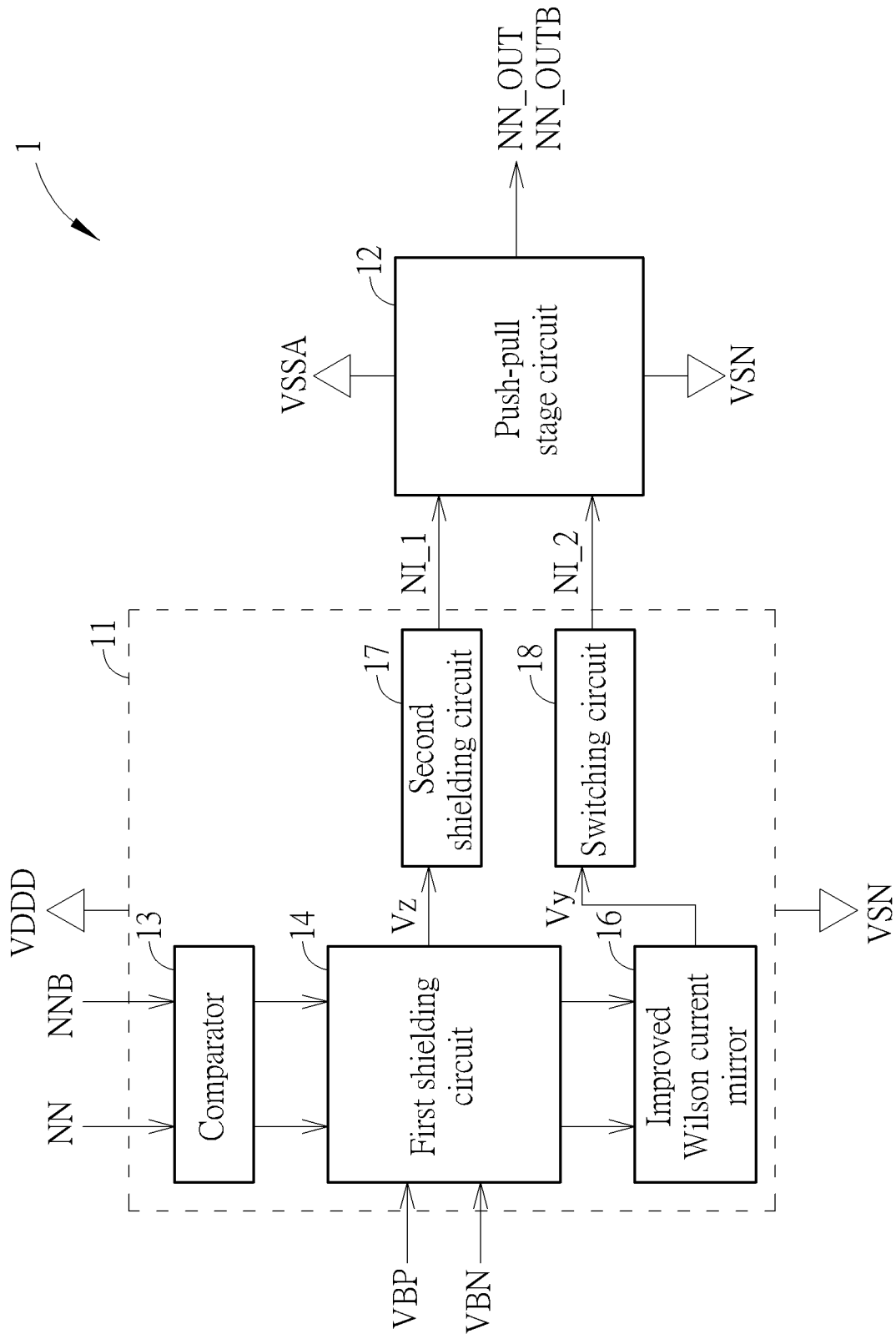
FIG. 1A is a functional block diagram of a negative voltage-level shifter according to an embodiment of the present invention.
Figure 1B:
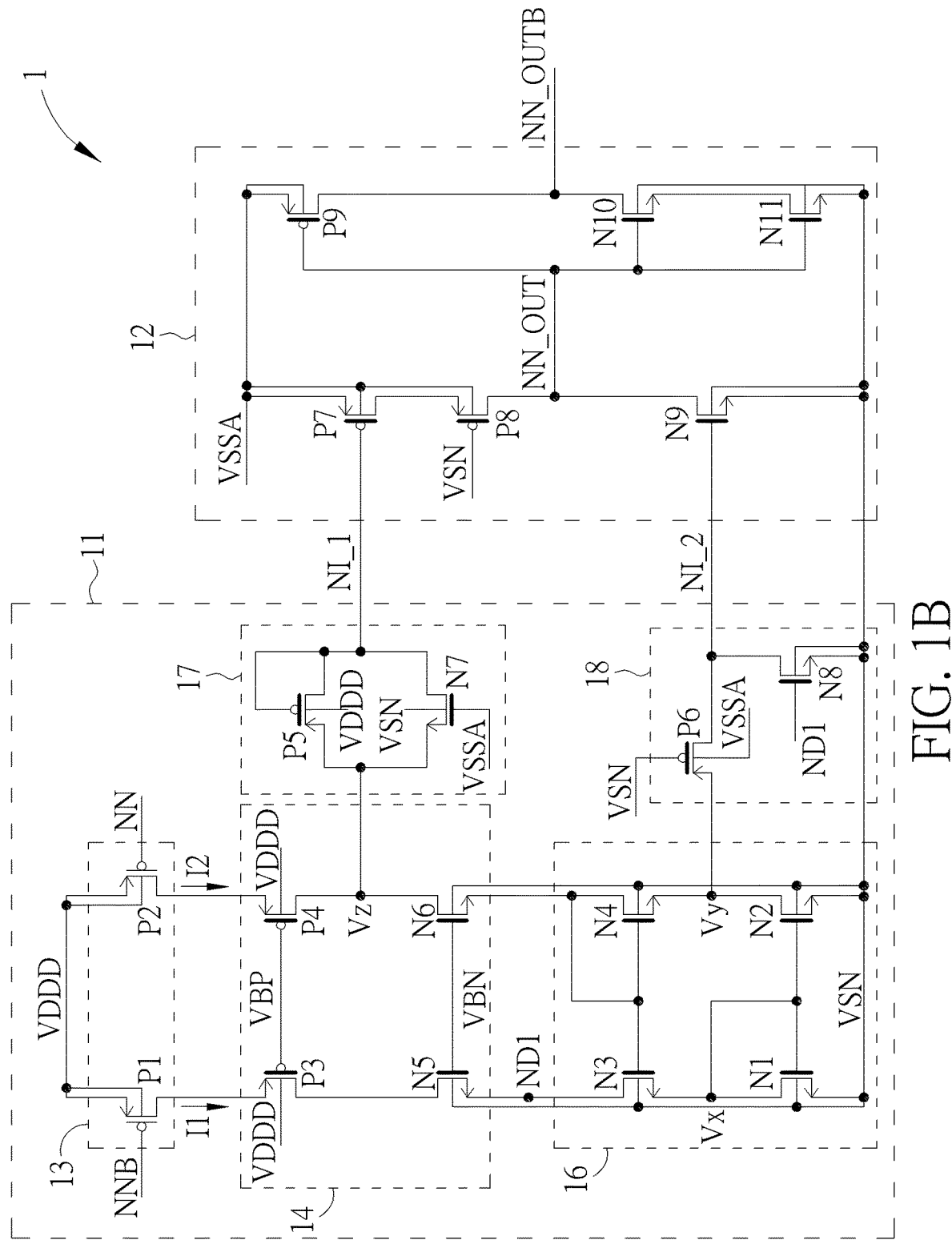
FIG. 1B is a schematic diagram of a negative voltage-level shifter according to an embodiment of the present invention.

FIG. 1A is a functional block diagram of a negative voltage-level shifter 1 according to an embodiment of the present invention. FIG. 1B is a schematic diagram of the negative voltage-level shifter 1 according to an embodiment of the present invention. The voltage-level shifter 1 includes an input stage circuit 11 and a push-pull stage circuit 12.

In FIG. 1A, the input stage circuit 11 is configured to generate a first intermediate signal NI_1 and a second intermediate signal NI_2 with a first voltage swing between a first system voltage VDDD and a second system voltage VSN according to a first input logic signal NNB and a second input logic signal NN, wherein the second input logic signal NN is a reverse-phase signal of the first input logic signal NNB. The first system voltage VDDD is positive, the second system voltage VSN is negative, and an absolute of the system voltage VSN is greater than an absolute of the first system voltage VDDD (|VSN|>VDDD), which is not limited.

The input stage circuit 11 includes a comparator 13, a first shielding circuit 14, a current mirror 16, a second shielding circuit 17, and a switching circuit 18.

The push-pull stage circuit 12 is coupled to the input stage circuit 11, and configured to generate a first output signal NN_OUT and a second output signal NN_OUTB with a second voltage swing between a ground voltage VSSA and the negative system voltage VSN according to the first intermediate signal NI_1 and the second intermediate signal NI_2.

In FIG. 1B, the comparator 13 is configured to compare the first input logic signal NNB with the second input logic signal NN, and includes a first P-type transistor P1 and a second P-type transistor P2. The first shielding circuit 14 is coupled to the comparator 13, configured to reduce a voltage stress applied to the comparator 13 (due to a voltage difference from the first system voltage VDDD to the second system voltage VSN) according to a third system voltage VBN, and includes a third P-type transistor P3 and a fourth P-type transistor P4. The current mirror 16 is configured to adjust magnitudes of the first and second intermediate signals NI_1 and NI_2, and includes a first N-type transistor N1, a second N-type transistor N2, a third N-type transistor N3 and a fourth N-type transistor N4. The first shielding circuit 14 is further coupled to the current mirror 16, configured to reduce a voltage stress applied to the current mirror 16 according to a fourth system voltage VBN, and includes a fifth N-type transistor N5 and a sixth N-type transistor N6. The second shielding circuit 17 is coupled to the first shielding circuit 14, configured to generate the first intermediate signal NI_1 according to a first operating voltage Vz of the input stage circuit 11, and includes a fifth P-type transistor P5 and a seventh N-type transistor N7. The switching circuit 18 is coupled to the current mirror 16, configured to generate the second intermediate signal NI_2 according to a second operating voltage Vy of the input stage circuit 11, and includes a sixth P-type transistor P6 and an eighth N-type transistor N8.

Regarding the comparator 13, the first P-type transistor P1 includes a source and a body coupled to the first system voltage VDDD, a gate coupled to the first input logic signal NNB, and a drain coupled to a source of the third P-type transistor P3. The second P-type transistor P2 includes a source and a body coupled to the first system voltage VDDD, a gate coupled to the second input logic signal NN, and a drain coupled to a source of the fourth P-type transistor P4. The first P-type transistor P1 and the second P-type transistor P2 are configured to compare the first input logic signal NNB with the second input logic signal NN to generate a first current I1 and a second current I2, respectively. When the input logic signal NNB is at a logic "0" state and the reversed input logic signal NN is at a logic "1" state, the first current I1 is much greater than the second current I2 (I1>>I2). Otherwise, when the input logic signal NNB is at the logic "1" state and the reversed input logic signal NN is at the logic "0" state, the second current I2 is much greater than the first current I1 (I2>>I1).

Regarding the first shielding circuit 14, the third P-type transistor P3 includes a source coupled to the drain of the first P-type transistor P1, a body coupled to the first system voltage VDDD, a gate coupled to the third system voltage VBP, and a drain coupled to a drain of the fifth N-type transistor N5. The fourth P-type transistor P4 includes a source coupled to the drain of the second P-type transistor P2, a body coupled to the first system voltage VDDD, a gate coupled to the third system voltage VBP, and a drain coupled to a drain of the sixth N-type transistor N6 and the second state circuit 12.

Note that the first P-type transistor P1 and the second P-type transistor P2 are low voltage devices, the source-to-drain voltage of the transistors P1 and P2 should be smaller than a maximum voltage that it can endure, for example, the source-to-drain voltage of the transistors P1 and P2 should be equal or smaller than the first system voltage VDDD (i.e., $V_{SD.P1} \leq VDDD$, $V_{SD.P2}$ VDDD). Beside the transistors P1 and P2, the other transistors included in the negative voltage-level shifter 1 are medium voltage devices.

The third P-type transistor P3 is configured to reduce the source-to-drain voltage of the first P-type transistor P1 by a sum of the third system voltage VBP and an absolute threshold voltage of the third P-type transistor P3 (i.e., $V_{S.P1}=VBP+|V_{TH.P3}|$) when the transistors P3, N1, N3 and N5 are turned on. By controlling the voltage level of the third system voltage VBP, the voltage stress of the first P-type transistor P1 is ensured to be less than the first system voltage VDDD. Similarly, the fourth P-type transistor P4 is configured to reduce the source-to-drain voltage of the second P-type transistor P2 by a sum of the fourth system voltage VBP and an absolute threshold voltage of the fourth P-type transistor P4 (i.e., $V_{S.P4}=VBN+|V_{TH.P4}|$) when the transistors P4, N2, N4 and N6 are turned on. By controlling the voltage level of the third system voltage VBP, the voltage stress of the second P-type transistor P2 is ensured to be less than the first system voltage VDDD.

The fifth N-type transistor N5 includes the source coupled to the drain of the third N-type transistor N3, a gate coupled to a fourth system voltage VBN, a body coupled to the second system voltage VSN, and the drain coupled to the drain of the third P-type transistor P3. The sixth N-type transistor N6 includes a source coupled to the drain and the gate of the fourth N-type transistor N4, a gate coupled to the fourth system voltage VBN, a body coupled to the second system voltage VSN, and the drain coupled to the drain of the fourth P-type transistor P4. The fifth N-type transistor N5 is configured to reduce a source-to-drain voltage or a body-to-drain voltage of the third N-type transistor N3 by a difference between the fourth system voltage VBN and an absolute threshold voltage of the fifth N-type transistor N5 (i.e., $V_{DN1}=V_{S.N5}=VBN-|V_{TH.N5}|$) when the transistors P1, P3, N1 and N3 are turned on. By controlling the voltage level of the fourth system voltage VBN, the voltage stress of the third N-type transistor N3 is released. Similarly, the sixth N-type transistor N6 is configured to reduce a source-to-drain voltage of the fourth N-type transistor N4 by a difference between the fourth system voltage VBN and an absolute threshold voltage of the sixth N-type transistor N6 (i.e., $V_{S,N6}$=VBN−|$V_{TH,N6}$|) when the transistors P2, P4, N2 and N4 are turned on. By controlling the voltage level of the fourth system voltage VBN, the voltage stress of the fourth N-type transistor N4 is released.

Figure 6:
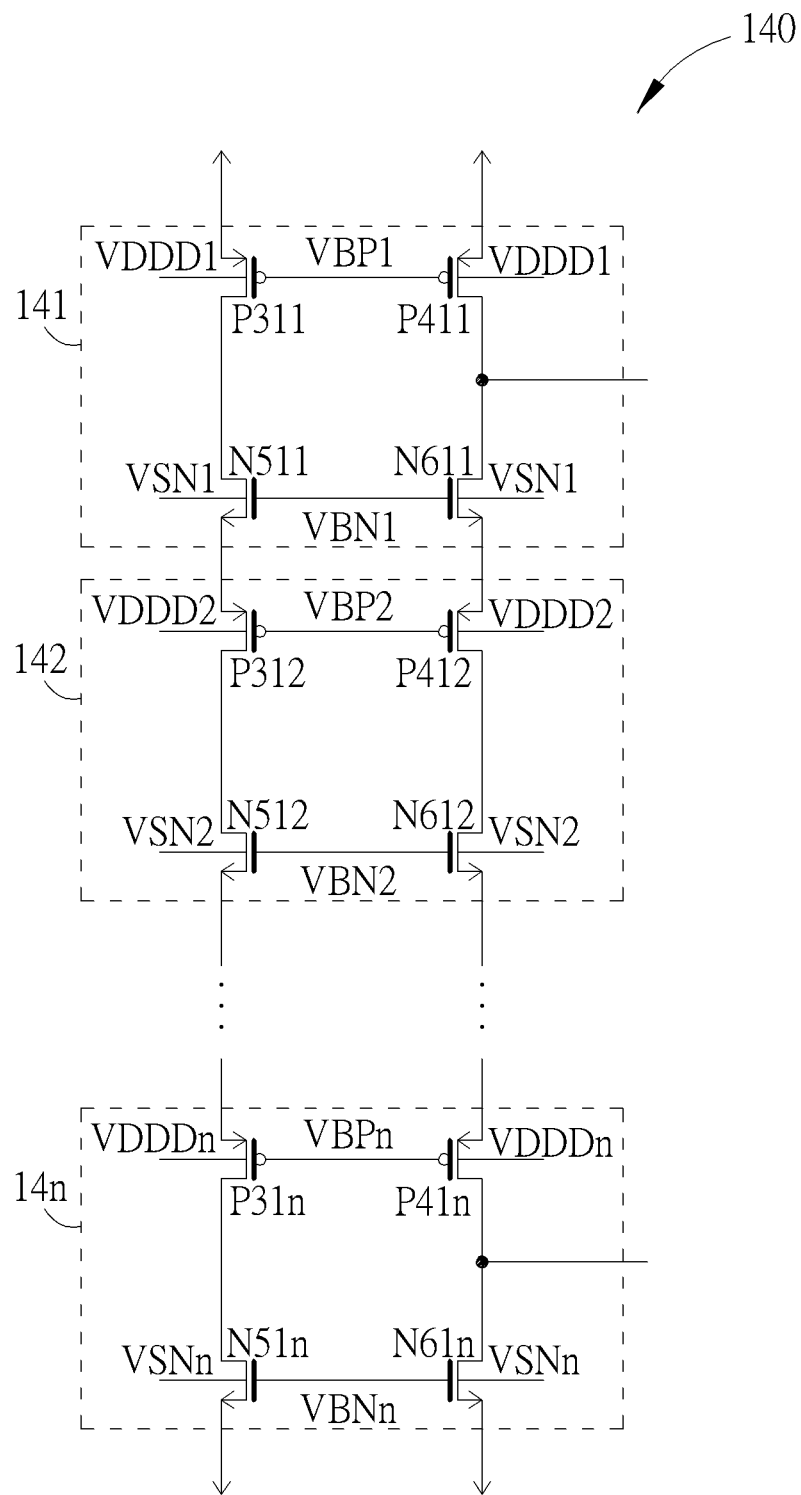
FIG. 6 is a schematic diagram of an input stage circuit according to an embodiment of the present invention.
Figure 7:
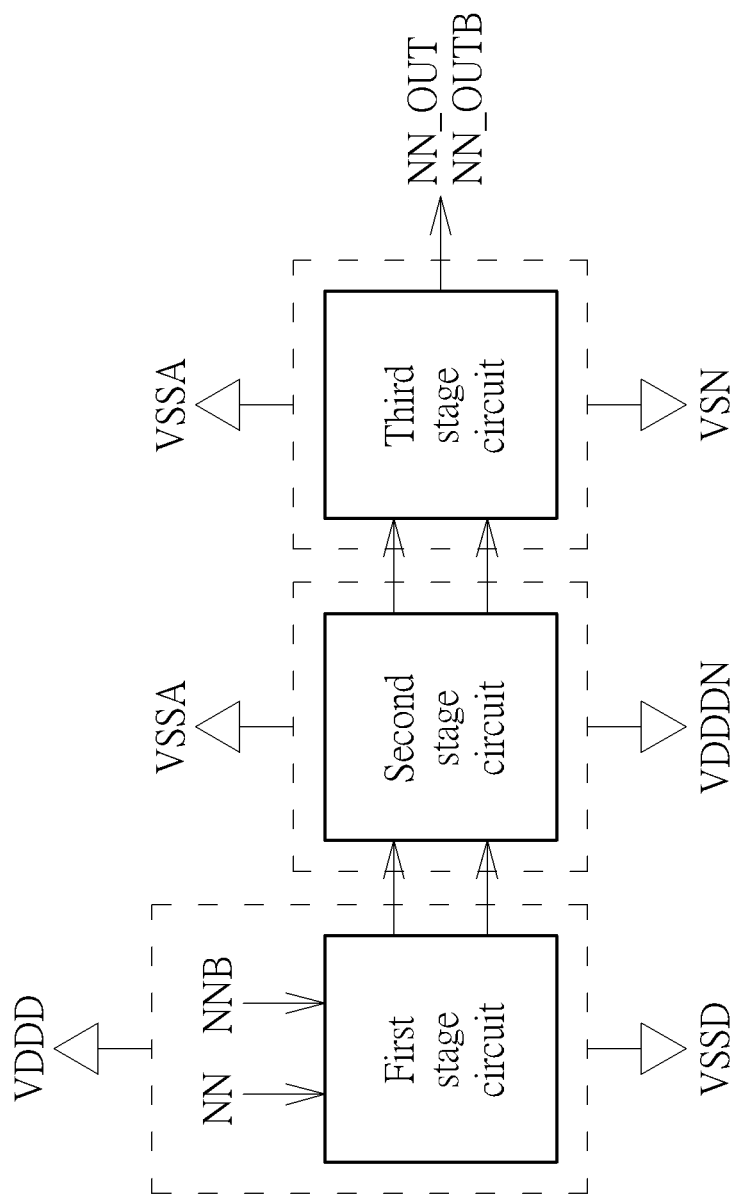
FIG. 7 is a functional block diagram of a negative level shifter according to the prior art.

In one embodiment, a plurality of the first shielding circuits 14 may be cascaded between the comparator 13 and the current mirror 16. For example, FIG. 6 is a schematic diagram of a first shielding circuit 140 according to an embodiment of the present invention. The first shielding circuit 140 includes a plurality of shielding units 141 to 14n cascaded between the comparator 13 (not shown in FIG. 6) and the current mirror 16 (not shown in FIG. 6) to provide voltage shielding and release the voltage stress of the transistors of the comparator 13 and the current mirror 16. The plurality of shielding units 141 to 14n may be controlled by voltages that are different from the system voltages VDDD, VSN, VBP and VBP.

For example, in the shielding unit 141, bodies of P-type transistors P311 and P411 are connected to a first system voltage VDDD1 and, gates of the P-type transistors P311 and P411 are connected to a third system voltage VBP1; bodies of N-type transistors N511 and N611 are connected to a second system voltage VSN1, and gates of the N-type transistors N511 and N611 are connected to a fourth system voltage VBP1.

In the shielding unit 142, bodies of P-type transistors P312 and P412 are connected to a first system voltage VDDD2, and gates of the P-type transistors P312 and P412 are connected to a third system voltage VBP2; bodies of N-type transistors N512 and 612 are connected to a second system voltage VSN2, and gates of the N-type transistors N512 and 612 are connected to a fourth system voltage VBN.

And so on, in the shielding unit 14n, bodies of P-type transistors P31n and P41n are connected to a first system voltage VDDDn, and gates of the P-type transistors P31n and P41n are connected to a third system voltage VBPn; bodies of N-type transistors N51n and N61n are connected to a second system voltage VSNn, and gates of the N-type transistors N51n and N61n are connected to a fourth system voltage VBNn. Each of the system voltages VDDD1 to VDDDn is different, each of the system voltages VBP1 to VBPn is different, each of the system voltages VBN1 to VBNn is different, and each of the system voltages VSN1 to VSNn is different.

Regarding the current mirror 16, the first N-type transistor N1 includes a source and a body coupled to the second system voltage VSN, a gate and a drain coupled to a source of the third N-type transistor N3. The second N-type transistor N2 includes a source and a body coupled to the second system voltage VSN, a gate coupled to the gate of the first N-type transistor N1, and a drain coupled to a source of the fourth N-type transistor N4. The third N-type transistor N3 includes the source coupled to the drain and the gate of the first N-type transistor N1 and the gate of the second N-type transistor N2, a gate coupled to a gate and a drain of the fourth N-type transistor N4, a body coupled the second system voltage VSN, and a drain coupled to a source of the fifth N-type transistor N5. The fourth N-type transistor N4 includes the source coupled to the drain of the second N-type transistor N2, the gate and the drain coupled to the gate of the third N-type transistor N3.

In operation, when the second current I2 is much greater than the first current (I2>>I1), the current mirror 16 operates as a traditional current mirror; while the second current I2 is much smaller than the first current (I2<<I1), the drain voltage of the fourth N-type transistor N4 is not smaller than a sum of the second system voltage VSN, an overall (drain-to-source) voltage of the second N-type transistor N2, and a threshold voltage of the fourth N-type transistor N4 (i.e., $V_{D,N4}$>=VSN+$V_{OV,N2}$+$V_{TH,N4}$) to turn on the third N-type transistor N3 and the fourth N-type transistor N4, thereby the current mirror 16 operates as Wilson current mirror.

Regarding the second shielding circuit 17, the fifth P-type transistor P5 includes a source coupled to the drain of the fourth P-type transistor P4, a body coupled to the first system voltage VDDD, a gate and a drain coupled to a gate of the seventh P-type transistor P7. The fifth P-type transistor P5 is turned on when a source voltage of the fifth P-type transistor P5 is greater than a sum of the first intermediate signal NI_1 and a threshold voltage of the fifth P-type transistor P5 (i.e., Vz>$V_{NI}$+$V_{TH,P5}$)/meanwhile the first intermediate signal NI 1 equals the source voltage of fifth P-type transistor P5 subtracting the threshold voltage of fifth P-type transistor P5 (i.e., $V_{NI\_1}$=Vz−$V_{TH,P5}$). The fifth P-type transistor P5 is turned off when the source voltage of the fifth P-type transistor P5 is smaller than the sum of the first intermediate signal NI_1 and a threshold voltage of the fifth P-type transistor P5 (i.e., $V_{S,P5}$<$V_{NI\_1}$+$V_{TH,P5}$) meanwhile the first intermediate signal NI_1 is determined by on/off states of the seventh N-type transistor N7. The seventh N-type transistor N7 includes a source coupled to the drain of the fifth P-type transistor P5, a body coupled to the second system voltage VSN, a gate coupled to the fifth system voltage VSSA, and a drain coupled to the source of the fifth P-type transistor P5, the drain of the sixth N-type transistor N6 and the drain of the fourth P-type transistor P4. The seventh N-type transistor N7 is turned on when a drain voltage of the seventh N-type transistor N7 is smaller than the fifth system voltage VSSA subtracting a threshold voltage of the seventh N-type transistor N7 (i.e., $V_{D,N7}$<VSSA−$V_{TH,N7}$) meanwhile the first intermediate signal NI 1 equals the source voltage of seventh N-type transistor N7. The seventh N-type transistor N7 is turned off when the drain voltage of the seventh N-type transistor N7 is greater than the fifth system voltage VSSA subtracting the threshold voltage of the seventh N-type transistor N7 (i.e., $V_{D,N7}$>VSSA−$V_{TH,N7}$), meanwhile the first intermediate signal NI_1 is determined by on/off states of the fifth P-type transistor P5.

Regarding the switching circuit 18, the sixth P-type transistor P6 includes a source coupled to the source of the fourth N-type transistor N4 and the drain of the second N-type transistor N2, a gate coupled to the second system voltage VSN, a body coupled to the fifth system voltage VSSA, and a drain coupled to a drain of the eighth N-type transistor N8. The eighth N-type transistor N8 includes a source and a body coupled to the second system voltage VSN, a gate coupled to a node ND1, and a drain coupled to the drain of the sixth P-type transistor P6.

When the first input logic signal NNB is at the logic "0" state ($V_{NNB}$=VSSD, VSSD may be a ground voltage) and the second input logic signal NN is at the logic "1" state ($V_{NN}$=VDDD), a third operating voltage Vx equals a sum of the second system voltage VSN and the threshold voltage of the first N-type transistor N1 (Vx=VSN+$V_{TH,N1}$) and the second operating voltage Vy equals a sum of the second system voltage VSN and the threshold voltage of the second N-type transistor N2 (Vy=VSN+$V_{TH.N2}$) meanwhile the second operating voltage Vy is too high to turn on the sixth P-type transistor P6 due to a body effect that makes the threshold voltage of the sixth P-type transistor P6 higher than the absolute threshold voltage of the second N-type transistor N2 (i.e., $|V_{TH.P6}|>V_{TH.N2}$). Further, the voltage of the node ND1 is great enough to turn on the eighth N-type transistor N8, and the voltage of the second intermediate signal NI_2 is pulled to the second system voltage VSN.

When the first input logic signal NNB is at the logic "1" state ($V_{NNB}$=VDDD) and the second input logic signal NN is at the logic "0" state ($V_{NN}$=VSSD), the eighth N-type transistor N8 is turned off, meanwhile the sixth P-type transistor P6 is turned on because a source-to-gate voltage of the sixth P-type transistor P6 is greater than the absolute threshold voltage of the sixth P-type transistor P6 (i.e., $V_{SG.P6}$=Vy−VSN>$|V_{TH.P6}|$). Further, the voltage of the second intermediate signal NI_2 becomes the fourth system voltage VBN subtracting the threshold voltages of the N-type transistors N6 and N5 (i.e., $V_{NI\_2}$=VBN−$V_{TH.N6}$−$V_{TH.N4}$). In one embodiment, the source of the sixth P-type transistor P6 is not limited to connecting to the second operating voltage Vy, the source of the sixth P-type transistor P6 may be connected to any nodes on the current path of the second current I2 according to required voltage levels.

The eighth N-type transistor N8 is configured to form a current path for the second intermediate signal NI_2 according to the drain voltage of the third N-type transistor N3 (wherein the node ND1 is coupled to the drain of the third N-type transistor N3) when the eighth N-type transistor N8 is slightly turned on or off by the drain voltage of the third N-type transistor N3), so the current of the second intermediate signal NI_2 returns to the second system voltage VSN through the eighth N-type transistor N8, which avoids current leakage of the ninth N-type transistor N9.

The push-pull stage circuit 12 includes a seventh P-type transistor P7, an eighth P-type transistor P8, a ninth P-type transistor P9, a ninth N-type transistor N9, a tenth N-type transistor N10, and an eleventh N-type transistor N11. The seventh P-type transistor P7 includes a source and a body coupled to the fifth system voltage VSSA, a gate coupled to the drain of the fifth P-type transistor P5 and the source of the seventh N-type transistor N7, and a drain coupled to a source of the eighth P-type transistor P8. The eighth P-type transistor P8 includes the source coupled to the drain of the ninth N-type transistor N9, a body coupled to the fifth system voltage VSSA, a gate coupled to the second system voltage VSN, and a drain coupled to a drain of the nine N-type transistor N9. The ninth N-type transistor N9 includes the drain coupled to the drain of the eighth P-type transistor P8 for outputting the first output signal NN_OUT, a body coupled to the second system voltage VSN, a gate coupled to the drain of the sixth P-type transistor P6 and the drain of the eighth N-type transistor N8. The ninth P-type transistor P9 includes a source and a body coupled to the fifth system voltage VSSA, a gate coupled to the drain of the eighth P-type transistor P8, and a drain coupled to a drain of the tenth N-type transistor N10. The tenth N-type transistor N10 includes the drain coupled to the drain of the ninth P-type transistor for outputting the second output signal NN_OUTB, a body coupled to the second system voltage VSN, a gate coupled to the gate of the ninth P-type transistor P9, and a source coupled to a drain of the eleventh N-type transistor N11. The eleventh N-type transistor N11 includes the drain coupled to the source of the tenth N-type transistor N10, a body and a source coupled to the second system voltage VSN, and a gate coupled to the gate of the ninth P-type transistor P9.

In one embodiment, in consideration of layout area minimization, the P-type transistors P1, P2, P3, P4 and P5 are n-well P-type transistors sharing a same power domain, wherein the bodies of the transistors P1, P2, P3, P4 and P5 are connected to the same first system voltage, VDDD. The P-type transistors P6, P7, P8 and P9 are n-well P-type transistors sharing a same power domain, wherein the bodies of the transistors P6, P7, P8 and P9 are connected to the same fifth system voltage, VSSA. Then-well P-type transistors sharing the same power domain may be arranged compactly, so the negative voltage-level shifter 1 may be area-efficient and power-efficient. In other embodiment, in consideration of circuit design flexibility, the P-type transistors P1, P2, P3, P4 and P5 may not sharing a same power domain. For example, the bodies of the P-type transistors P3, P4 and P5 may be connected to another system voltage to control the body-to-gate voltages adapted to various applications. There is one application that VBP, VBN, and VSSA are the same.

In short, in the negative voltage-level shifter 1 in FIG. 1A and FIG. 1B, the present invention uses the first voltage shielding circuit 14 to release the voltage stress of the transistors of the comparator 13 and the current mirror 16 in the input stage circuit 11. The present invention further uses the switching circuit 18 with the current path to avoid current leakage from the second intermediate signal NI_2. In addition, designing the power domain(s) of the n-well P-type transistors in the negative voltage-level shifter 1 make the negative voltage-level shifter 1 area-efficient and power-efficient or design-flexible and application-adaptive.

Figure 2:
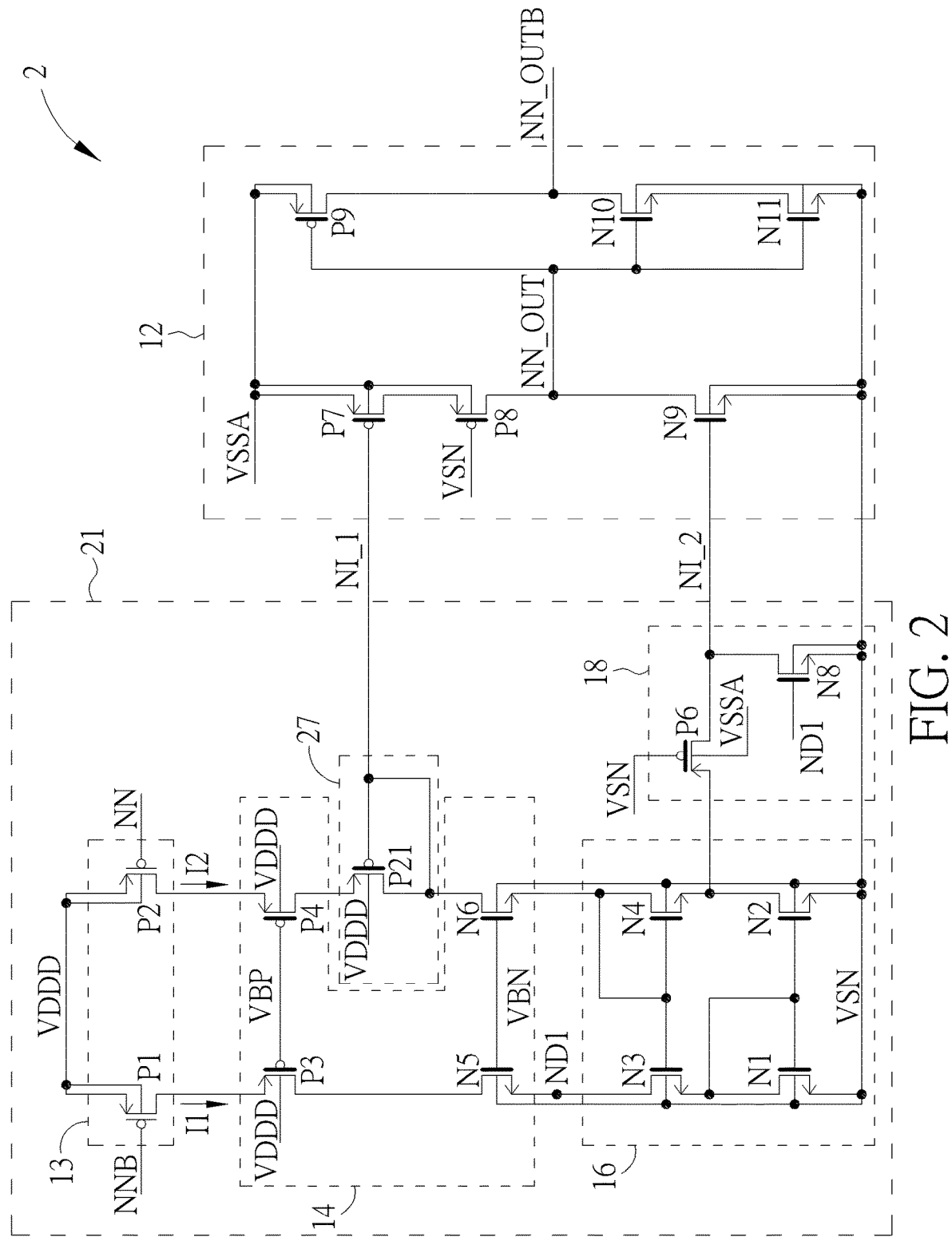
FIG. 2 is a schematic diagram of a negative voltage-level shifter according to an embodiment of the present invention.

FIG. 2 is a schematic diagram of a negative voltage-level shifter 2 according to an embodiment of the present invention. The negative voltage-level shifters 1 and 2 are similar, and the same elements are denoted with the same symbols. The negative voltage-level shifter 2 includes an input stage circuit 21 and a push-pull stage circuit 12. The input stage circuit 21 includes a comparator 13, a first shielding circuit 14, a current mirror 16, a second shielding circuit 27, and a switching circuit 18.

The second shielding circuit 27 is coupled to the first shielding circuit 14, and includes a P-type transistor P21. The P-type transistor P21 includes a source coupled to the fourth P-type transistor P4 of the first shielding circuit 14, a body coupled to the first system voltage VDDD, a gate and a drain coupled to the drain of the sixth N-type transistor N6 of the first shielding circuit 14. The gate and the drain of the P-type transistor P21 output the first intermediate signal NI_1. The P-type transistor P21 is an n-well P-type transistor sharing a same power domain VDDD with the P-type transistors P1, P2, P3, and P4.

Figure 3:
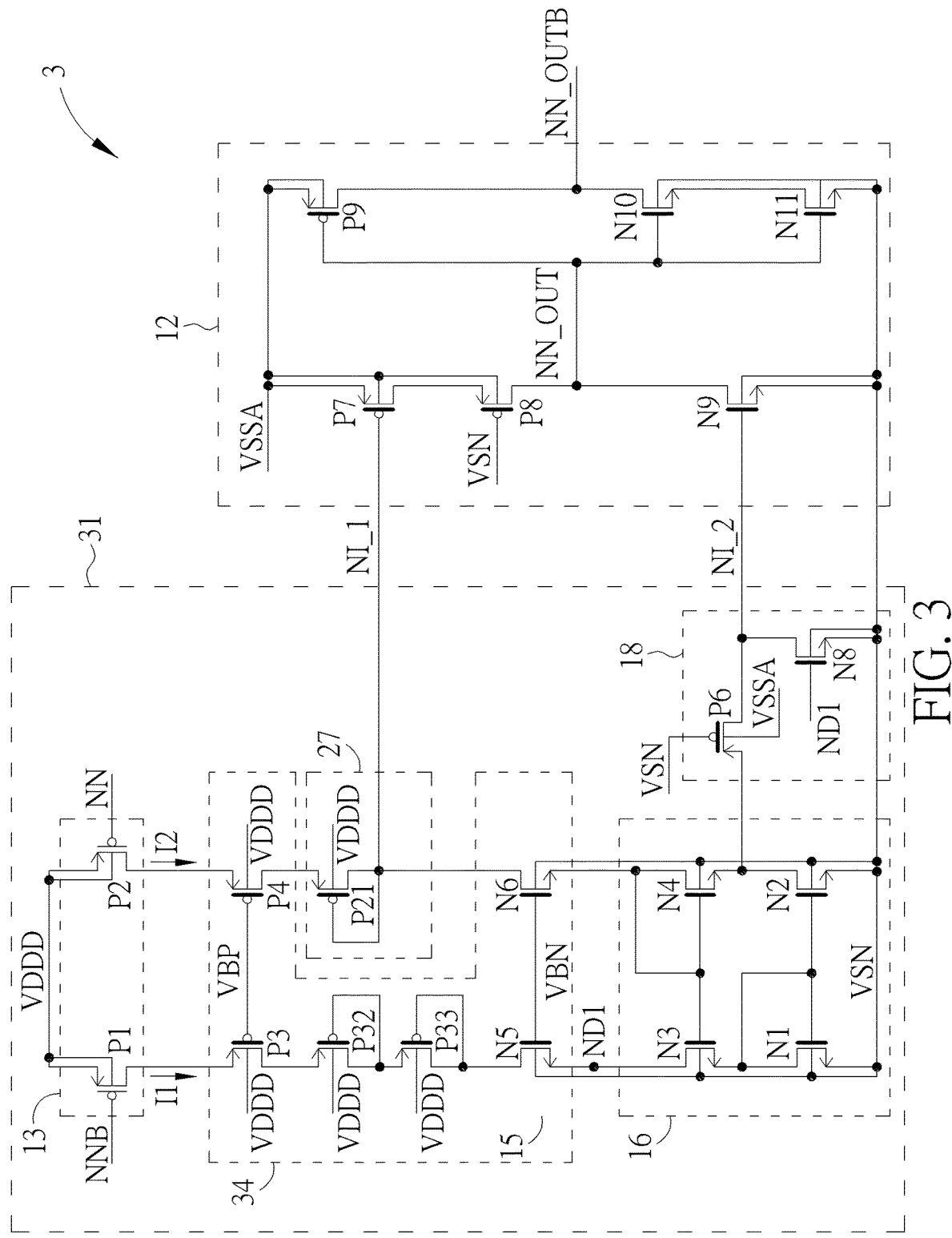
FIG. 3 is a schematic diagram of a negative voltage-level shifter according to an embodiment of the present invention.

FIG. 3 is a schematic diagram of a negative voltage-level shifter 3 according to an embodiment of the present invention. The negative voltage-level shifters 1 and 3 are similar, same elements are denoted with same symbols. The negative voltage-level shifter 3 includes an input stage circuit 31 and a push-pull stage circuit 12. The input stage circuit 31 includes a comparator 13, a first shielding circuit 34, a current mirror 16, a second shielding circuit 27, and a switching circuit 18.

The first shielding circuit 34 is coupled to the comparator 13 and the current mirror 16, and includes P-type transistors P3, P4, P32 and P33. The P-type transistor P32 includes a source coupled to the drain of the third P-type transistor P3, a body coupled to the first system voltage VDDD, a gate and a drain coupled to a source of the P-type transistor P33. The P-type transistor P33 includes the source coupled to the gate and the drain of the P-type transistor P32, a body coupled to the first system voltage VDDD, a gate and a drain coupled to the drain of the fifth N-type transistor N5. When the first input logic signal NNB is at the logic "0" state ($V_{NNB}$=VSSD) and the second input logic signal NN is at the logic "1" state ($V_{NN}$=VDDD), the first current I1 is much greater than the second current I2; meanwhile the drain voltage of the fifth N-type transistor N5 is smaller than the first system voltage VDDD subtracting absolute threshold voltages of the transistors P3, P32 and P33 and the third system voltage VBP (i.e. $V_{D,N5}$<VDDD−|$V_{TH,P3}$|−|$V_{TH,P32}$|−$V_{TH,P33}$|−VBP). By decreasing VBP, the drain voltage of the fifth N-type transistor N5 also can be decreased to reduce a body-to-drain voltage of the fifth N-type transistor N5.

The P-type transistor P21, P32 and P33 are n-well P-type transistors sharing a same power domain (e.g., the first system voltage VDDD) with the P-type transistors P1, P2, P3, and P4, which is not limited.

Figure 4:
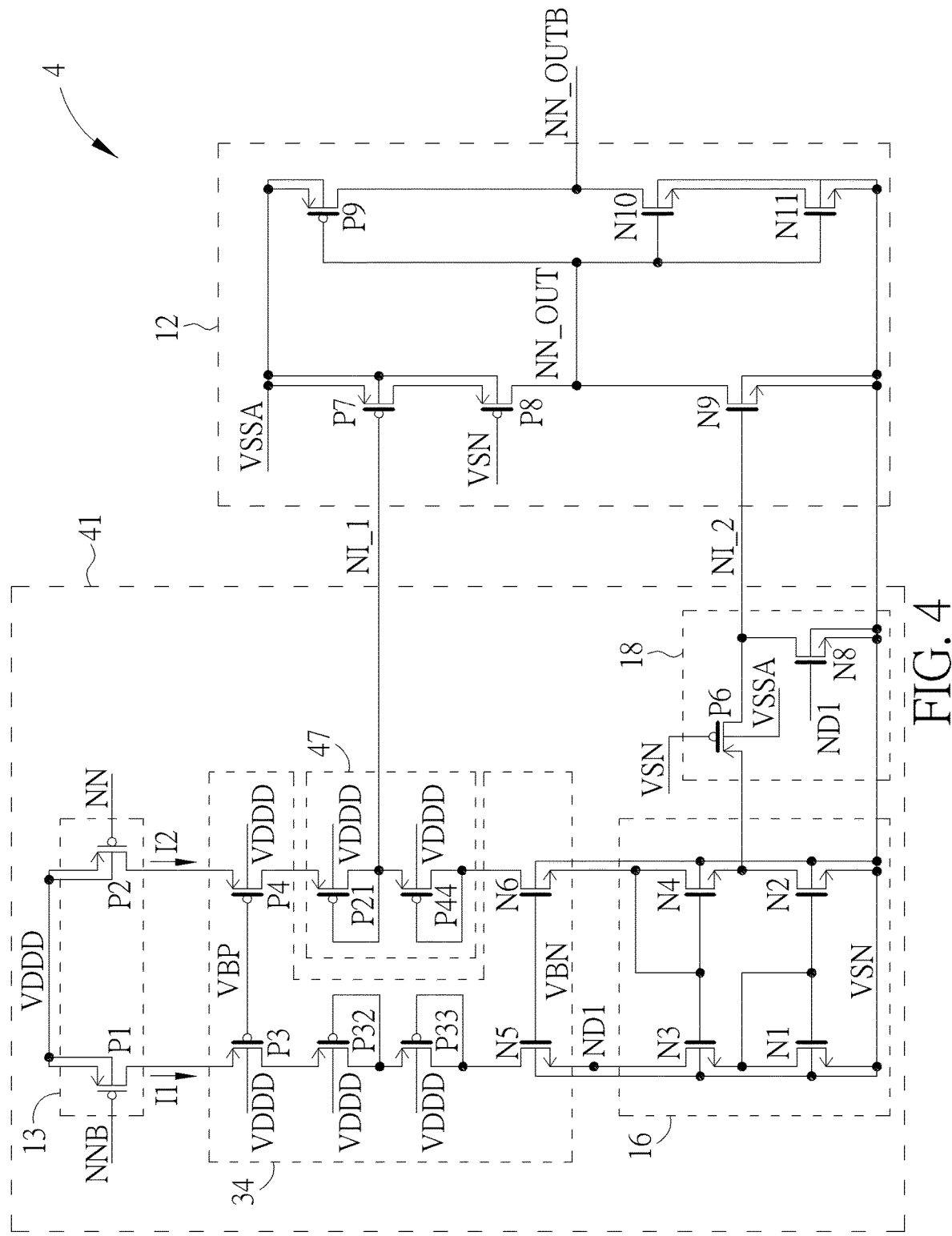
FIG. 4 is a schematic diagram of a negative voltage-level shifter according to an embodiment of the present invention.

FIG. 4 is a schematic diagram of a negative voltage-level shifter 4 according to an embodiment of the present invention. The negative voltage-level shifters 1 and 4 are similar, same elements are denoted with same symbols. The negative voltage-level shifter 4 includes an input stage circuit 41 and a push-pull stage circuit 12. The input stage circuit 41 includes a comparator 13, a first shielding circuit 34, a current mirror 16, a second shielding circuit 47, and a switching circuit 18.

The second shielding circuit 47 is coupled to the first shielding circuit 14, and includes P-type transistors P21 and P44. The P-type transistor P44 includes the source coupled to the gate and the drain of the P-type transistor P21, a body coupled to the first system voltage VDDD, a gate and a drain coupled to the drain of the sixth N-type transistor N6 of the first shielding circuit 14. The second shielding circuit 47 reduces a body-to-drain voltage of the sixth N-type transistor N6.

Figure 5A:
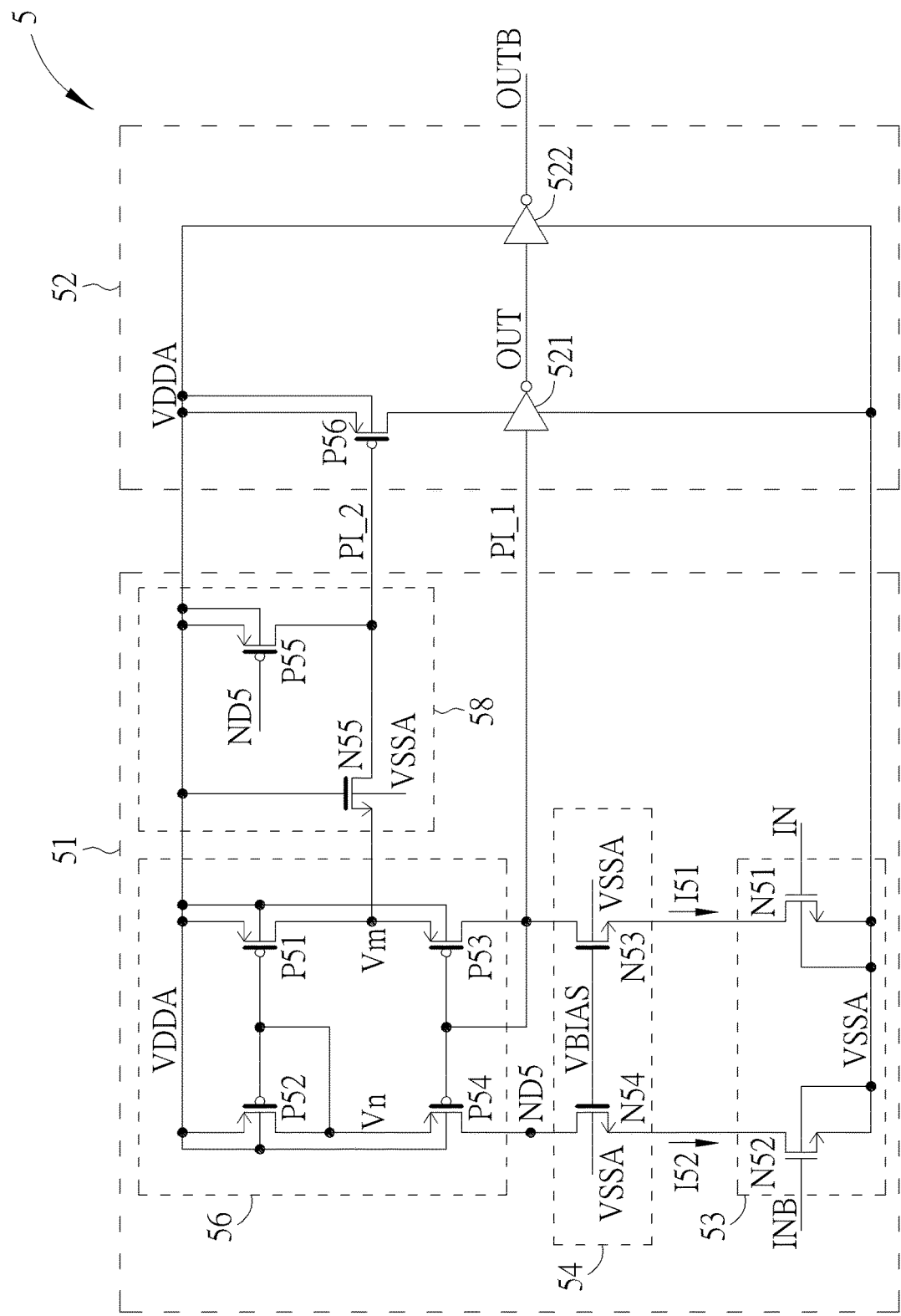
FIG. 5A is a schematic diagram of a positive voltage-level shifter according to an embodiment of the present invention.

FIG. 5A is a schematic diagram of a positive voltage-level shifter 5 according to an embodiment of the present invention. The positive voltage-level shifter 5 is designed based on the circuit structure of the negative voltage-level shifter 1 in FIG. 1A. The positive voltage-level shifter 5 includes an input stage circuit 51 and a push-pull stage circuit 52.

The input stage circuit 51 is configured to generate a first intermediate signal PI_1 and a second intermediate signal PI_2 with a first voltage swing between a first system voltage VDDA and a second voltage VSSA according to a first input logic signal INB and a second input logic signal IN, wherein the second input logic signal IN is a reverse-phase signal of the first input logic signal INB. The input stage circuit 51 includes a comparator 53, a shielding circuit 54, a current mirror 56, and a switching circuit 58.

The comparator 53 includes a first N-type transistor N51 and a second N-type transistor N52. The shielding circuit 54 is coupled to the comparator 53, configured to generate the first intermediate signal PI_1, and includes a third P-type transistor P53 and a fourth P-type transistor P54. The current mirror 56 is coupled to the shielding circuit 54, and includes a first P-type transistor P51, a second P-type transistor P52, a third P-type transistor P53 and a fourth P-type transistor P54. The switching circuit 58 is coupled to the current mirror 56, configured to generate the second intermediate signal PI_2 according to a second operating voltage Vm, and includes a fifth P-type transistor P55 and a fifth N-type transistor N55.

Regarding the comparator 53, the first N-type transistor N51 includes a source and a body coupled to a second system voltage VSSA, agate coupled to the second input logic signal IN, and a drain coupled to a source of the third N-type transistor N53. The second N-type transistor N52 includes a source and a body coupled to the second system voltage VSSA, a gate coupled to the first input logic signal INB, and a drain coupled to a source of the fourth P-type transistor P54. The first N-type transistor N51 and the second N-type transistor N52 are configured to compare the first input logic signal INB with the second input logic signal IN to generate a first current I51 and a second current I52, respectively. When the input logic signal IN is at a logic "0" state and the reversed input logic signal INB is at a logic "1" state, the second current I52 is much greater than first current I51 (I52>>I51). Otherwise, when the input logic signal IN is at the logic "1" state and the reversed input logic signal INB is at the logic "0" state, the first current I51 is much greater than the first current I52 (I51>>I52).

Regarding the shielding circuit 54, the third N-type transistor N53 includes a source coupled to the drain of the first N-type transistor N51, a body coupled to the second system voltage VSSA, a gate coupled to a third system voltage VBIAS, and a drain coupled to a drain and a gate of the third P-type transistor P53 and a gate of the fourth P-type transistor P54. The fourth N-type transistor N54 includes a source coupled to the drain of the second N-type transistor N52, a body coupled to the second system voltage VSSA, a gate coupled to the third system voltage VBIAS, and a drain coupled to a drain of the fourth P-type transistor P54. A drain voltage ($V_{D,N51}$) of the first N-type transistor N51 equals the third system voltage VBIAS subtracting an absolute threshold voltage of the third N-type transistor N53 (i.e., VBIAS−|$V_{TH,N53}$|) when the transistors N51, P51 and P53 are turned on. By controlling the voltage level of the third system voltage VBIAS, the overall voltage of the first N-type transistor N51 is ensured to be less than the maximum voltage that it can endure. Similarly, a drain voltage ($V_{D,N52}$) of the second N-type transistor N52 equals the third system voltage VBIAS subtracting an absolute threshold voltage of the fourth N-type transistor N54 (i.e., VBIAS−|$V_{TH,N54}$|) when the transistors N52, P52 and P54 are turned on. By controlling the voltage level of the third system voltage VBIAS, the overall voltage of the second N-type transistor N52 is ensured to be less than the maximum voltage that it can endure.

Note that the first N-type transistor N51 and the second N-type transistor N52 are low voltage devices, the source-to-drain (or body-to-drain) voltages of the transistors N51 and N52 should be smaller than the maximum voltage that it can endure, for example, the source-to-drain voltage of the transistors N51 and N52 should be smaller or equal to the first system voltage VDDD ($V_{SD,N51}$=<VDDD, $V_{SD,N52}$=<VDDD). The rest of transistors included in the negative voltage-level shifter 5 are medium voltage devices.

Regarding the current mirror 56, includes the first P-type transistor P51 a source and a body coupled to the first system voltage VDDA, a gate coupled to a gate and a drain of the second P-type transistor P52. The second P-type transistor P52 includes a source and a body coupled to the first system voltage VDDA, the gate and the drain coupled to the gate of the first P-type transistor P51. The third P-type transistor P53 includes the source coupled to the drain of the first P-type transistor P51, the gate and the drain coupled to the drain of the third N-type transistor N53 and the gate of the fourth P-type transistor P54, and a body coupled the first system voltage VDDA. The fourth P-type transistor P54 includes the source coupled to the drain and the gate of the second P-type transistor P52 and the gate of the first P-type transistor P51, the gate coupled to the gate and the drain of the third P-type transistor P53 and the drain of the third N-type transistor N53, a body coupled to the first system voltage VDDA, and the drain coupled to the drain of the fourth N-type transistor N54. The current mirror 56 is the Wilson current mirror structure.

Regarding the switching circuit 58, the fifth N-type transistor N55 includes a source coupled to the source of the third P-type transistor P53 and the drain of the first P-type transistor P51, a gate coupled to the first system voltage VDDA, a body coupled to the second system voltage VSSA, and a drain coupled to a drain of the fifth P-type transistor P55. The fifth N-type transistor N55 is configured to generate the second intermediate signal PI_2 when a drain voltage of the first P-type transistor P51 is smaller than the first system voltage VDDA subtracting a threshold voltage of the first P-type transistor P55 (i.e., $V_{D,P51}$<VDDA−$V_{TH,P55}$, wherein $V_{PI\_2}=V_{D,P51}$) The fifth P-type transistor P55 includes a source and a body coupled to the first system voltage VDDA, a gate coupled to a node ND5, and the drain coupled to the drain of the fifth N-type transistor N55.

When the first input logic signal INB is at the logic "0" state ($V_{INB}$=VSSD) and the second input logic signal IN is at the logic "1" state ($V_{IN}$=VDDD), the first current I51 is much greater than second current I52 (I51>>I52) to pull low the first and second intermediate signals PI_1 and PI_2 to the second system voltage VSSA, and the voltage of the node ND5 is close to the first system voltage VDDA. The second intermediate signal PI_2 (PI_2=Vm) turns on the six P-type transistor P56, the voltage of the node ND5 turns off the fifth P-type transistor P55. In this case, the first output signal OUT equals the first system voltage VDDA (OUT=VDDA), and the second output signal OUTB equals the second system voltage VSSA (OUTB=VSSA).

When the first input logic signal INB is at the logic "1" state ($V_{INB}$=VDDD) and the second input logic signal IN is at the logic "1" state ($V_{IN}$=VSSD), the second current I52 is much greater than first current I51 (I52>>I51) to pull high the first and second intermediate signals PI_1 and PI_2 to the first system voltage VDDA, the voltage of the node ND5 is close to the second system voltage VSSA. The voltage of the node ND5 turns on the fifth P-type transistor P55 to pull the second intermediate signal PI_2 to the first system voltage VDDA, and the second intermediate signal PI_2 turns off the six P-type transistor P56. The first intermediate signal PI_1 is couple to the first inverter 521. In this case, the first output signal OUT equals the second system voltage VSSA (OUT=VSSA), and the second output signal OUTB equals the first system voltage VSSA (OUTB=VDDA).

The fifth P-type transistor P55 is configured to form a current path for the second intermediate signal PI_2 according to the source voltage of the fourth P-type transistor P54 (wherein the node ND5 is coupled to the source of the fourth P-type transistor P54) when the fifth P-type transistor P55 is slightly turned on (or off) by the source voltage of the fourth P-type transistor P54), so the current of the second intermediate signal PI_2 returns to the first system voltage VDDA through the fifth P-type transistor P55, which avoids current leakage of the sixth P-type transistor P56.

The push-pull stage circuit 52 is coupled to the input stage circuit 51, and configured to generate a first output signal OUT and a second output signal OUTB with the first voltage swing between the first system voltage VDDA and second system voltage VSSA according to the first intermediate signal PI_1 and the second intermediate signal PI_2.

Figure 5B:
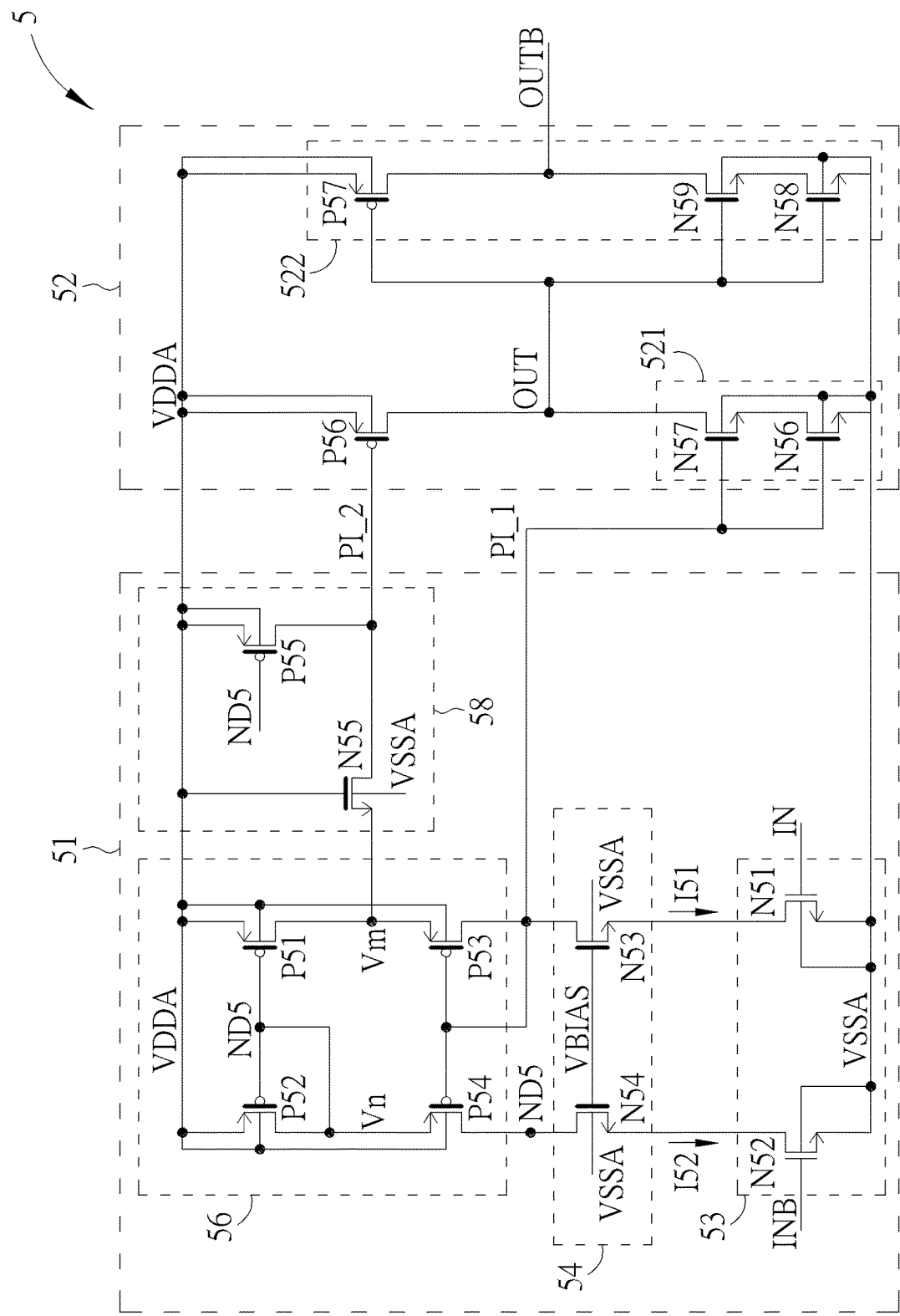
FIG. 5B is a schematic diagram of a positive voltage-level shifter according to an embodiment of the present invention.

The push-pull stage circuit 52 includes a sixth P-type transistor P56, a first inverter 521, and a second inverter 522. FIG. 5B is a schematic diagram of the positive voltage-level shifter 5 according to an embodiment of the present invention. In FIG. 5B, the first inverter 521 includes a sixth N-type transistor N56 and a seventh N-type transistor N57, and the second inverter 522 includes a seventh P-type transistor P57, an eighth N-type transistor N58, and a ninth N-type transistor N59. The first inverter 521 is configured to convert the first intermediate signal PI_1 into the first output signal OUT according to a bias current controlled by the sixth N-type transistor N56. The second inverter 522 is configured to convert the first output signal OUT into the second output signal OUTB.

The sixth P-type transistor P56 operate as a variable resistor, and includes a source and a body coupled to the first system voltage VDDA, a gate coupled to the drains of the transistors P55 and N55, and a drain coupled to a drain of the seventh N-type transistor N57 and gates of the transistors P57, N58 and N59. The sixth N-type transistor N56 includes a source and a body coupled to the second system voltage VSSA, a gate coupled to the drain of the third N-type transistor N53 of the shielding circuit 54, and a drain coupled to a source of the seventh N-type transistor N57. The seventh N-type transistor N57 includes the source coupled to the drain of the sixth N-type transistor N56, a body coupled to the second system voltage VSSA, a gate coupled to the drain of the third N-type transistor N53 of the shielding circuit 54, and the drain coupled to the drain of the sixth P-type transistor P56. The sixth P-type transistor P56 and the seventh N-type transistor N57 operate as an inverter configured to generate the first output signal OUT. The sixth N-type transistor N56 and the seventh N-type transistor N57 are configured to decrease an inrush current during switching transition.

The seventh P-type transistor P57 includes a source and a body coupled to the first system voltage VDDA, a gate coupled to the drains of the transistors P56 and N57, and a drain coupled to a drain of the ninth N-type transistor N59. The eighth N-type transistor N58 includes a source and a body coupled to the second system voltage VSSA, a gate coupled to the gate of the seventh P-type transistor P57, and a drain coupled to the ninth N-type transistor N59. The ninth N-type transistor N59 includes the source coupled to the drain of the eighth N-type transistor N58, a body coupled to the second system voltage VSSA, a gate coupled to the gates of the transistors P57 and N58, and the drain coupled to the drain of the seventh P-type transistor P57. Note that the drains of the transistors P56 and N57 output the first output signal OUT, and the drains of the transistors P57 and N59 output the second output signal OUTB. The seventh P-type transistor P57, the eighth N-type transistor N58 and the ninth N-type transistor N59 operate as an inverter configured to invert the first output signal OUT to generate the second output signal OUTB. The eighth N-type transistor N58 and the ninth N-type transistor N59 are configured to decrease an inrush current during switching transition.

In short, in the positive voltage-level shifter 5 in FIG. 5A and FIG. 5B, the present invention uses the voltage shielding circuit 54 to release the voltage stress of the transistors in the input stage circuit 53. The present invention further uses the switching circuit 58 with the current path to avoid current leakage from the sixth P-type transistor P56.

To sum up, the present invention provides a voltage level shifter architecture applicable for positive and negative voltage shifting, in which a shielding circuit is configured to relax the voltage stress of the transistors in the input stage circuit, and a switching circuit is configured to avoid current leakage. In addition, designing the power domain(s) of the n-well P-type transistors in the voltage-level shifter may make the voltage-level shifter area-efficient and power-efficient or design-flexible and application-adaptive.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A negative voltage-level shifter, comprising:
   an input stage circuit configured to generate a first intermediate signal and a second intermediate signal with a first voltage swing between a first system voltage and a second system voltage according to a first input logic signal and a second input logic signal, comprising:
     a comparator configured to compare the first input logic signal with the second input logic signal;
     a current mirror configured to adjust magnitudes of the first intermediate signal and the second intermediate signal;
     a first shielding circuit coupled to the current mirror and the comparator, and configured to reduce a first voltage stress applied to the comparator according to a third system voltage and reduce a second voltage stress applied to the current mirror according to a fourth system voltage;
     a second shielding circuit coupled to the first shielding circuit, and configured to generate the first intermediate signal according to a first operating voltage of the input stage circuit; and
     a switching circuit coupled to the second shielding circuit and the current mirror, and configured to generate the second intermediate signal according to a second operating voltage of the input stage circuit; and
   a push-pull stage circuit coupled to the second shielding circuit and the switching circuit, and configured to generate a first output signal and a second output signal with a second voltage swing between the third system voltage and the second system voltage according to the first intermediate signal and the second intermediate signal;
   wherein the second shielding circuit is configured to reduce a third voltage stress applied to the push-pull stage circuit;
   wherein the first system voltage is positive, and the second system voltage is negative.

2. The negative voltage-level shifter of claim 1, wherein the comparator comprises:
   a first P-type transistor comprising a source and a body coupled to the first system voltage, a gate coupled to the first input logic signal, and a drain coupled to the first shielding circuit; and
   a second P-type transistor comprising a source and a body coupled to the first system voltage, a gate coupled to the second input logic signal, and a drain coupled to the first shielding circuit.

3. The negative voltage-level shifter of claim 1, wherein the first shielding circuit comprises:
   a third P-type transistor comprising a source coupled to a drain of a first P-type transistor of the comparator, a body coupled to the first system voltage, a gate coupled to the third system voltage, and a drain;
   a fourth P-type transistor comprising a source coupled to a drain of a second P-type transistor of the comparator, a body coupled to the first system voltage, a gate coupled to the third system voltage, and a drain coupled to the second shielding circuit;
   a fifth N-type transistor comprising a source coupled to a drain of a third N-type transistor of the current mirror, a gate coupled to the fourth system voltage, a body coupled to the second system voltage, and a drain coupled to the drain of the third P-type transistor; and
   a sixth N-type transistor comprising a source coupled to a drain and a gate of a fourth N-type transistor of the current mirror, a body coupled to the second system voltage, and a drain coupled to the drain of the fourth P-type transistor.

4. The negative voltage-level shifter of claim 3,
   wherein a drain voltage of the first P-type transistor equals a sum of the third system voltage and an absolute threshold voltage of the third P-type transistor, a drain voltage of the second P-type transistor equals a sum of the third system voltage and an absolute threshold voltage of the fourth P-type transistor;
   wherein a drain voltage of the third N-type transistor equals the fourth system voltage subtracting a threshold voltage of the fifth N-type transistor, and a drain voltage of the fourth N-type transistor equals the fourth system voltage subtracting a threshold voltage of the sixth N-type transistor;
   wherein the first P-type transistor and the second P-type transistor are low voltage devices, the first system voltage subtracting the drain voltage of the first P-type transistor is smaller than a maximum overall voltage that the first P-type transistor can endure, and the first system voltage subtracting the drain voltage of the second P-type transistor is smaller than the maximum overall voltage that the second P-type transistor can endure.

5. The negative voltage-level shifter of claim 1, further comprising a plurality of the first shielding circuits cascaded between the comparator and the current mirror.

6. The negative voltage-level shifter of claim 1, wherein the current mirror comprises:
   a first N-type transistor comprising a source and a body coupled to the second system voltage, a gate and a drain;
   a second N-type transistor comprising a source and a body coupled to the second system voltage, a gate coupled to the gate and the drain of the first N-type transistor, and a drain;
   a third N-type transistor comprising a source coupled to the drain and the gate of the first N-type transistor N1 and the gate of the second N-type transistor, a gate, a body coupled the second system voltage, and a drain coupled to a fifth N-type transistor of the second shielding circuit; and
   a fourth N-type transistor comprising a source coupled to the drain of the second N-type transistor and a source of a six P-type transistor of the switching circuit, a gate and a drain coupled to the gate of the third N-type transistor, and a body coupled the second system voltage.

7. The negative voltage-level shifter of claim 1, wherein the second shielding circuit comprises:
   a fifth P-type transistor comprising a source coupled to the first operating voltage, a body coupled to the first system voltage, a gate and a drain coupled to a drain of a seventh N-type transistor and a gate of a seventh P-type transistor of the push-pull stage circuit; and the seventh N-type transistor comprising the source coupled to the drain of the fourth P-type transistor and the drain of the sixth N-type transistor, a body coupled to the second system voltage, a gate coupled to the fifth system voltage, and the drain coupled to the drain and the gate of the fifth P-type transistor and the gate of the seventh P-type transistor of the push-pull stage circuit;

wherein the first intermediate signal is reduced by an amount of a threshold voltage of the fifth P-type transistor when the fifth P-type transistor is turned on, to reduce the third voltage stress applied to the gate of the seventh P-type transistor of the push-pull stage circuit.

8. The negative voltage-level shifter of claim 7, wherein the first operating voltage is at a drain of a fourth P-type transistor of the first shielding circuit and a drain of a sixth N-type transistor of the first shielding circuit.

9. The negative voltage-level shifter of claim 1, wherein the switching circuit comprises:
 a sixth P-type transistor comprising a source coupled to the second operating voltage, a gate coupled to the second system voltage, a body coupled to the fifth system voltage, and a drain coupled to a gate of a ninth N-type transistor of the push-pull stage circuit; and
 an eighth N-type transistor comprising a source and a body coupled to the second system voltage, a gate coupled to a drain of a third N-type transistor of the current mirror, and a drain coupled to the drain of the sixth P-type transistor and the gate of the ninth N-type transistor of the push-pull stage circuit;
 wherein the drain of the sixth P-type transistor and the drain of the eighth N-type transistor transmit the second intermediate signal to the push-pull stage circuit;
 wherein the eighth N-type transistor is configured to form a current path for the second intermediate signal when the eighth N-type transistor is slightly turned on or off by a third operating voltage of the input stage circuit.

10. The negative voltage-level shifter of claim 9, wherein the second operating voltage is at a source of a fourth N-type transistor of the current mirror and a drain of a second N-type transistor of the current mirror, and the third operating voltage is at a source of a fifth N-type transistor of the first shielding circuit and a drain of a third N-type transistor of the current mirror.

11. The negative voltage-level shifter of claim 1, wherein the second shielding circuit comprises:
 a fifth P-type transistor comprising a source coupled to a drain of a fourth P-type transistor of the first shielding circuit, a body coupled to the first system voltage, a gate and a drain coupled to a drain of a sixth N-type transistor of the switching circuit and a gate of a seventh P-type transistor of the push-pull circuit;
 wherein the gate and the drain of the fifth P-type transistor transmit the first intermediate signal to the push-pull circuit.

12. The negative voltage-level shifter of claim 11, wherein the first shielding circuit comprises:
 a third P-type transistor comprising a source coupled to a drain of a first P-type transistor of the comparator, a body coupled to the first system voltage, a gate coupled to the third system voltage, and a drain;
 a fourth P-type transistor comprising a source coupled to a drain of a second P-type transistor of the comparator, a body coupled to the first system voltage, a gate coupled to the third system voltage, and a drain coupled to the second shielding circuit;
 a fifth N-type transistor comprising a source coupled to a drain of a third N-type transistor of the current mirror, a gate coupled to the fourth system voltage, a body coupled to the second system voltage, and a drain coupled to the drain of the third P-type transistor; and
 a sixth N-type transistor comprising a source coupled to a drain and a gate of a fourth N-type transistor of the current mirror, a body coupled to the second system voltage, and a drain coupled to the drain of the fourth P-type transistor;
 a tenth P-type transistor comprising a source coupled to a drain of a third P-type transistor of the first shielding circuit, a body coupled to the first system voltage, a gate and a drain; and
 an eleventh P-type transistor comprising a source coupled to the gate and the drain of the tenth P-type transistor, a body coupled to the first system voltage, a gate and a drain coupled to a drain of a fifth N-type transistor of the first shielding circuit.

13. The negative voltage-level shifter of claim 12, wherein the second shielding circuit comprises:
 a twelfth P-type transistor comprising a source coupled to the gate and the drain of the fifth P-type transistor, a body coupled to the first system voltage, a gate and a drain coupled to the drain of the sixth N-type transistor of the first shielding circuit.

14. The negative voltage-level shifter of claim 1, wherein the push-pull stage circuit comprises:
 a seventh P-type transistor comprising a source and a body coupled to the fifth system voltage, a gate coupled to the second shielding circuit, and a drain;
 an eighth P-type transistor comprising a source coupled to the drain of the seventh P-type transistor, a body coupled to the fifth system voltage, a gate coupled to the second system voltage, and a drain for outputting the first output signal;
 a ninth N-type transistor comprising a drain coupled to the drain of the eighth P-type transistor, a body coupled to the second system voltage, a gate coupled to the switching circuit;
 a ninth P-type transistor comprising a source and a body coupled to the fifth system voltage, a gate coupled to the drain of the eighth P-type transistor, and a drain for outputting the second output signal;
 a tenth N-type transistor comprising a drain coupled to the drain of the ninth P-type transistor, a body coupled to the second system voltage, a gate coupled to the gate of the ninth P-type transistor, and a source; and
 an eleventh N-type transistor comprising a drain coupled to the source of the tenth N-type transistor, a body and a source coupled to the second system voltage, and a gate coupled to the gate of the ninth P-type transistor and the gate of the tenth N-type transistor;
 wherein the sixth P-type transistor, the seventh P-type transistor, the eighth P-type transistor, and the ninth P-type transistor are n-well P-type transistors sharing a same power domain of the third system voltage.

15. A positive voltage-level shifter, comprising:
 an input stage circuit configured to generate a first intermediate signal and a second intermediate signal with a voltage swing between a first system voltage and a second system voltage according to a first input logic signal and a second input logic signal, comprising:
 a comparator configured to compare the first input logic signal with the second input logic signal;

a shielding circuit coupled to the comparator, configured to reduce a voltage stress applied to the comparator, and generate the first intermediate signal;
a current mirror configured to adjust magnitudes of the first intermediate signal and the second intermediate signal; and
a switching circuit coupled to the current mirror, and configured to generate the second intermediate signal according to a second operating voltage of the input state circuit; and
a push-pull stage circuit coupled to the switching circuit, the current mirror and the shielding circuit, and configured to generate a first output signal and a second output signal with the voltage swing according to the first intermediate signal and the second intermediate signal;
wherein the first system voltage is positive, and the second system voltage is a ground voltage.

16. The positive voltage-level shifter of claim 15, wherein the comparator comprises:
a first N-type transistor comprising a source and a body coupled to the second system voltage, a gate coupled to the second input logic signal, and a drain coupled to the shielding circuit; and
a second N-type transistor comprising a source and a body coupled to the second system voltage, a gate coupled to the first input logic signal, and a drain coupled to the shielding circuit.

17. The positive voltage-level shifter of claim 15, wherein the shielding circuit comprises:
a third N-type transistor comprising a source coupled to a drain of a first N-type transistor of the comparator, a body coupled to the second system voltage, a gate coupled to a third system voltage, and a drain coupled to a drain and a gate of a third P-type transistor of the current mirror; and
a fourth N-type transistor comprising a source coupled to a drain of a second N-type transistor of the comparator, a body coupled to the second system voltage, a gate coupled to the third system voltage, and a drain coupled to a drain of a fourth P-type transistor of the current mirror.

18. The positive voltage-level shifter of claim 17,
wherein a drain voltage of the first N-type transistor equals the third system voltage subtracting a threshold voltage of the third N-type transistor, and a drain voltage of the second N-type transistor equals the third system voltage subtracting a threshold voltage of the fourth N-type transistor;
wherein the first N-type transistor and the second N-type transistor are low voltage devices, the second system voltage subtracting the drain voltage of the first P-type transistor is smaller than a maximum overall voltage that the first N-type transistor can endure, and the second system voltage subtracting the drain voltage of the second N-type transistor is smaller than the maximum overall voltage that the second N-type transistor can endure;
wherein the third system voltage is positive.

19. The positive voltage-level shifter of claim 15, wherein the current mirror comprises:
a first P-type transistor comprising a source and a body coupled to the first system voltage, a drain and a gate;
a second P-type transistor comprising a source and a body coupled to the first system voltage, a gate and a drain coupled to the gate of the first P-type transistor;

a third P-type transistor comprising a source coupled to the drain of the first P-type transistor, a gate and a drain coupled to a drain of a third N-type transistor of the shielding circuit, and a body coupled the first system voltage; and
a fourth P-type transistor comprising a source coupled to the drain of the second P-type transistor, a gate coupled to the gate and the drain of the third P-type transistor, a body coupled to the first system voltage, and a drain coupled to a drain of a fourth N-type transistor of the shielding circuit;
wherein the drain and the gate of the third P-type transistor and the drain of the third N-type transistor transmit the first intermediate signal to the push-pull stage circuit.

20. The positive voltage-level shifter of claim 15, wherein the switching circuit comprises:
a fifth N-type transistor comprising a source coupled to the second operating voltage, a gate coupled to the first system voltage, a body coupled to the second system voltage, and a drain coupled to a gate of a sixth P-type transistor of the push-pull stage circuit; and
a fifth P-type transistor comprising a source and a body coupled to the first system voltage, a gate coupled to a third operating voltage of the input stage circuit, and a drain coupled to the drain of the fifth N-type transistor and the push-pull stage circuit;
wherein the fifth P-type transistor is configured to form a current path for the second intermediate signal when the fifth P-type transistor is slightly turned on or off by a source voltage of the fourth P-type transistor;
wherein the drain of the fifth P-type transistor and the drain of the fifth N-type transistor transmit the second intermediate signal to the push-pull stage circuit.

21. The positive voltage-level shifter of claim 20, wherein the second operating voltage is at a source of a third P-type transistor of the current mirror and a drain of a first P-type transistor of the current mirror, and the third operating voltage is at a drain of a fourth P-type transistor of current mirror and a drain of a fourth N-type transistor of the shielding circuit.

22. The positive voltage-level shifter of claim 15, wherein the push-pull stage circuit comprises:
a sixth P-type transistor comprising a source and a body coupled to the first system voltage, a gate coupled to a drain of a fifth P-type transistor of the switching circuit and a drain of a fifth N-type transistor of the switching circuit, and a drain;
a first inverter coupled to the sixth P-type transistor, and configured to convert the first intermediate signal into the first output signal according to a bias current controlled by the sixth N-type transistor; and
a second inverter coupled to the first inverter, and configured to convert the first output signal into the second output signal.

23. The positive voltage-level shifter of claim 22,
wherein the first inverter comprises:
a sixth N-type transistor comprising a source and a body coupled to the second system voltage, a gate coupled to a drain of a third N-type transistor of the shielding circuit and a gate and a drain of a third P-type transistor of the current mirror, and a drain;
a seventh N-type transistor comprising a source coupled to the drain of the sixth N-type transistor, a body coupled to the second system voltage, a gate coupled to the gate of the sixth N-type transistor, and a drain coupled to the drain of the sixth P-type transistor;

wherein the second inverter comprises:
a seventh P-type transistor comprising a source and a body coupled to the first system voltage, a gate coupled to the drain of the sixth P-type transistor and the drain of the seventh N-type transistor, and a drain;
an eighth N-type transistor comprising a source and a body coupled to the second system voltage, a gate coupled to the gate of the seventh P-type transistor, and a drain; and
a ninth N-type transistor comprising a source coupled to the drain of the eighth N-type transistor, a body coupled to the second system voltage, a gate coupled to the gate of the seventh P-type transistor and the gate of the eighth N-type transistor, and a drain coupled to the drain of the seventh P-type transistor.

* * * * *